United States Patent [19]

Vandegraaf

[11] 4,433,315
[45] Feb. 21, 1984

[54] TUNABLE COUPLING NETWORK

[75] Inventor: Johannes J. Vandegraaf, Lynchburg, Va.

[73] Assignee: General Electric Company, Lynchburg, Va.

[21] Appl. No.: 324,665

[22] Filed: Nov. 24, 1981

[51] Int. Cl.³ .......................... H03H 7/01; H03B 5/08
[52] U.S. Cl. .................................. 333/174; 333/176; 333/178; 331/76
[58] Field of Search ........................ 333/167, 174–180, 333/17 R; 331/76, 77; 307/510, 520, 521, 529

[56] References Cited

U.S. PATENT DOCUMENTS

| | | |
|---|---|---|
| 1,645,542 | 10/1927 | Osnos . |
| 1,669,103 | 5/1928 | Schaffer . |
| 1,683,127 | 9/1928 | Davis ................................. 333/176 |
| 1,839,442 | 1/1932 | Schaffer . |
| 2,025,129 | 12/1935 | Schaffer ........................... 333/175 X |
| 2,051,503 | 8/1936 | Usselman ......................... 333/124 X |
| 2,084,740 | 6/1937 | McKesson ....................... 333/176 X |
| 2,167,079 | 7/1939 | Landon ............................ 333/174 X |
| 2,253,381 | 8/1941 | Lee .................................. 333/176 X |
| 2,269,640 | 1/1942 | Thom ............................... 333/175 X |
| 2,303,410 | 11/1942 | Toth ................................. 333/177 |
| 2,321,376 | 6/1943 | Finch ............................... 333/176 |
| 2,840,697 | 6/1958 | Ocko et al. . |
| 3,437,931 | 4/1969 | Schutlz, Jr. ...................... 325/172 |
| 3,453,565 | 7/1969 | Carli ................................. 333/176 X |
| 3,519,737 | 7/1970 | Marsh, Jr. ........................ 333/177 |
| 4,182,997 | 1/1980 | Brambilla ......................... 333/175 |

Primary Examiner—Marvin L. Nussbaum
Attorney, Agent, or Firm—Cushman, Darby & Cushman

[57] ABSTRACT

A tunable coupling network for a frequency multiplier stage providing a passband for a desired harmonic of a fundamental frequency and rejection notches for undesired harmonic frequencies. The passband of the network can be tuned by changing the value of at least one circuit element to track the desired harmonic of the fundamental frequency over a range of fundamental frequencies. In so doing, the rejection notches also move so that they maintain fixed ratios with respect to the passband frequency as the passband moves. In one embodiment the network comprises first and second tunable circuits each including a variable reactive element. The first resonant circuit includes a variable capacitor and two fixed inductors. The second resonant circuit includes a variable inductor and two fixed capacitors. The two resonant circuits are coupled by an interstage coupling capacitor.

6 Claims, 3 Drawing Figures

TUNABLE COUPLING NETWORK

BACKGROUND OF THE INVENTION

This invention relates in general to frequency multiplier stages such as those commonly found in frequency modulated (FM) transmitters. Specifically, the invention provides a tunable coupling network that presents a passaband for a desired harmonic of a fundamental frequency while providing attenuation for undesired harmonics and/or the fundamental frequency itself.

FM transmitters often include frequency multiplier stages which comprise a class C amplifier that is terminated or coupled to a subsequent stage by a filter network. This filter network is tuned so as to pass a desired harmonic of an excitation signal and to reject certain undesired harmonics other than the desired one. For example, in a doubler circuit, the filter network is usually designed to pass a second harmonic and to reject both the fundamental frequency and the third harmonic. Higher order harmonics, although still present, usually do not present a problem. In a known filter network, undesired harmonics are suppressed by a narrow-band band pass filter formed by two or more coupled resonators. One example of such a filter is an aperture coupled helical resonator filter.

A known band pass configuration coupling network is shown in U.S. Pat. No. 2,303,410—Toth (Dec. 1, 1942), the disclosure of which is incorporated herein by reference. FIG. 1 (prior art) of this application substantially reproduces FIG. 3 of that patent. Although the patent shows a coupling network for an intermediate frequency amplifier, it is illustrative of the typical network arrangement that is known for use in multiplier stages. Referring now to FIG. 1 (prior art), the known filter network includes a first resonant circuit including fixed inductors L1 and L3 and a variable capacitor C1. This first resonant circuit is coupled via a coupling capacitor C5 to a second resonant circuit. The second resonant circuit includes a fixed capacitor C4, a fixed inductor L2 and a variable capacitor C2. Inductor L1 and capacitor C1 form a rejection circuit for a frequency above the intended passband (a desired harmonic) in a multiplier for a frequency below the desired passband (in the case of a multiplier, an undesired harmonic or a fundamental frequency). Inductor L3 resonates with the equivalent capacitive reactance of the L1-C1 combination at the passband frequency. Capacitor C4 resonates with the equivalent inductive reactance of the L2-C2 combination at the passband frequency.

In essence, the Toth arrangement provides a coupling network that generates rejection notches above and below the passband of the network. However there is an operational disadvantage associated with this type of network. It is substantially a fixed network in which component values must be appropriately selected. These networks are not tunable over a frequency range but will only operate at a fixed design frequency. The variable capacitor and inductor merely serve to peak their respective rejection circuits at the appropriate "design" frequency. This known network cannot be tuned to operate over a predetermined frequency range. It merely operates at a single frequency. Ideally, the network would be able to tune to a given harmonic of a fundamental frequency. When that fundamental frequency changes within a range, the circuit can be easily tuned to the given harmonic of the new fundamental frequency. In tuning to a new frequency, the relative locations of the rejection notches would be maintained at a fixed ratio with respect to the center tuned frequency.

Furthermore, for sufficient rejection of adjacent harmonics with an acceptable insertion loss, high-Q resonators are required. Due to their high cost and large size, it is impractical to incorporate high-Q resonators into miniaturized personal radios such as the PI-filters currently being used.

Since, as a design criterion, attenuation needs to be achieved only at harmonic frequencies, a matching network with finite attenuation poles at these frequencies would appear to be a promising design alternative. However, it is essential that when such a network is tuned to cover a band, i.e. capable of being tuned over a range of frequencies, that the rejection notches also move and that they remain in their proper relative locations. It would therefore be desirable to be able to accomplish tuning with a minimum of interacting adjustments. An ideal network would require only the peaking of stages to obtain both the band pass tuning for the desired harmonic and the tuning of rejection traps at the appropriate frequencies.

SUMMARY OF THE INVENTION

In order to overcome the operational disadvantages of known multiplier stage filter networks, the present invention provides a tunable coupling network providing adequate harmonic rejection with low insertion loss and which is small and inexpensive to fabricate and incorporate into electronic equipment.

A significant feature of the network provided by the present invention is that it is tunable over a range of frequencies while maintaining the correct relative positions of pass and rejection frequencies.

The present invention appears, on the surface, to be similar in general form to the prior art circuit shown in FIG. 1. However, the underlying concept and implementation of the circuit is fundamentally different. The circuit is configured such that the ratio of the finite pole frequency to the band pass frequency is independent of the variable elements. Thus, the ratio is independent of the tuning frequency. Therefore, over a predetermined range of frequencies, the network can be tuned so as to pass a desired harmonic and reject the fundamental or an undesired harmonic without the necessity of retuning every resident circuit in the filter network. The complete coupling network exhibits a center passband and has finite poles above and below the passband frequency determined by the ratios of the fixed elements in the resonant circuits. The variable elements change the passband frequency and relative rejection frequencies without altering the basic ratios established thereamong.

It is possible using the present invention to build doublers, triplers, or other multiplier circuits merely by selecting the appropriate pass rejection frequencies and selecting component values in accordance with the procedures and equations set forth in this patent. As another advantage of this invention, smaller (lower Q) inductors can be used than would be required in known filter networks while still maintaining adequate harmonic rejection.

Essentially the present invention provides a tunable coupling network for use with a non-linear amplifier stage for selecting frequency components of the nonlinear stage at a predetermined harmonic of a fundamental frequency excitation signal a multiplier circuit having rejection notches above and below the passband frequency of a desired harmonic of the fundamental frequency. The circuit includes at least one tunable component. The circuit component values are selected such that the circuit is tunable to select a desired harmonic over a predetermined range of fundamental frequencies, the rejection notches moving with the tuning of the circuit such that the notches are maintained at a predetermined ratio with respect to the passband when the circuit is tuned so that the passband tracks the desired harmonic of the fundamental frequency over the range of fundamental frequencies.

As a specific example, the present invention provides a doubler circuit for use with a non-linear amplifier stage generating a signal having a frequency component Fo and various harmonic frequency components including a second harmonic component 2Fo and a third harmonic component 3Fo, the doubler circuit being for isolating the second harmonic 2Fo by forming a passband at 2Fo and rejection frequencies at Fo and 3Fo comprising: a first trap having a first trap frequency defined by its elements and being tuned to 3Fo for shunting the third harmonic component to circuit ground, the first trap including a variable capacitor and having a net capacitive reactance at 2Fo; a first inductor coupled in parallel with the first trap and tuned such that the parallel combination of the first inductor with the first trap forms a parallel resonator establishing a passband at 2Fo; a second trap having a second trap frequency defined by its elements and being tuned to Fo for shunting the fundamental frequency component to circuit ground, the second trap including a variable inductor and having a net inductive reactance at 2Fo; a first capacitor coupled in parallel with the second trap and tuned such that the parallel combination of the first capacitor with the second trap forms a parallel rresonator establishing a passband at 2Fo; means for coupling said first and second traps in parallel with one another; whereby (a) when the value of the variable capacitor of said first trap is changed, the ratio of the rejection frequency of the first trap to the passband frequency is maintained constant at 3/2 and (b) when the value of the variable inductor of said second trap is changed, the ratio of the rejection frequency of the second trap to the passband frequency is maintained constant at $\frac{1}{2}$.

As another specific example, the present invention provides a tripler circuit for use with a non-linear amplifier stage generating a signal having a fundamental frequency component Fo and various harmonic frequency components including a second harmonic component 2Fo, a third harmonic component 3Fo, and a fourth harmonic component 4Fo, said tripler circuit for isolating the second harmonic 2Fo by forming a passband at 3Fo and rejection frequencies at 2Fo and 4Fo, comprising: a first trap having a first trap frequency defined by its elements and being tuned to 4Fo for shunting the fourth harmonic component to circuit ground, the first trap including a variable capacitor and having a net capacitive reactance at 3Fo; a first inductor coupled in parallel with the first trap and tuned such that the parallel combination of the first inductor with the first trap forms a parallel resonator establishing a passband at 3Fo; a second trap having a second trap frequency established by its elements and being tuned to 2Fo for shunting the second harmonic component to circuit ground, the second trap including a variable inductor and having a net inductive reactance at 3Fo; a first capacitor coupled in parallel with the second trap and tuned such that the parallel combination of the first capacitor with the second trap forms a parallel resonator establishing a passband at 3Fo; and means for coupling said first and second traps in parallel with one another; whereby (a) when the capacitance of the variable capacitor of the first trap is varied, the ratio of the passband frequency to the rejection frequency of the first trap is maintained constant at 4/3 remains constant and (b) when the inductance of the variable inductor of said second trap is varied the ratio of the rejection frequency of the second trap to the passband frequency is maintained constant at $\frac{2}{3}$.

Of course, by appropriate substitution of desired and rejection harmonics, suitable coupling circuits for other constants of multiplication can be designed. As an alternative, resonator circuits can be designed in accordance with the principles of the present invention and these resonator circuits can be coupled with conventional resonators tuned to a particular frequency as shown in the FIG. 3 embodiment, including a standard resonator between two rejection networks.

BRIEF DESCRIPTION OF THE DRAWING

The above objects, features and advantages of the present invention will be understood in greater detail from the following description and associated drawings, wherein.

DETAILED DESCRIPTION OF THE PREFERRED EMBODIMENT

Figure 1:
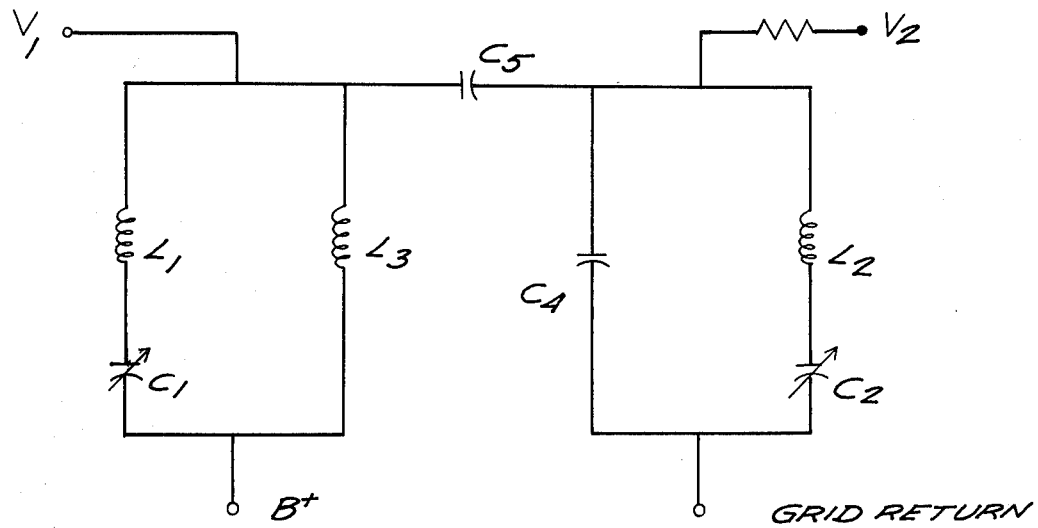
FIG. 1 is a schematic of a prior art filter circuit arranged for rejection both above and below a peak frequency.
Figure 2:
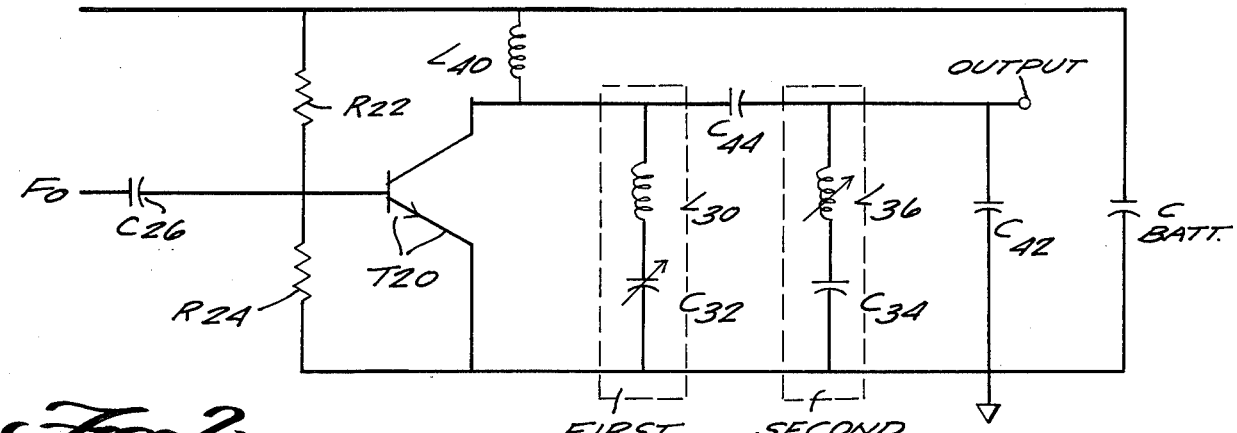
FIG. 2 is a schematic of the present invention in a doubler circuit network.

Referring now to FIG. 2, there is shown a schematic diagram of a doubler circuit network in accordance with the present invention. Although the present invention applies to multipliers in general, its features may be more fully appreciated from a detailed discussion of a specific circuit such as a doubler. Thus, the doubler circuit should be considered a non-limitative example only.

A transistor T20 is baised by resistors R22 and R24 and has an input coupled through a capacitor C26. This is assumed to be a non-linear amplifier stage such as a class C amplifier. Thus, transistor T20 produces various harmonics of a fundamental frequency Fo coupled to its input. A first trap (rejector circuit) is formed by a fixed inductor L30 and a variable capacitor C32 in series. This first trap is tuned to the third harmonic 3Fo of fundamental frequency Fo so that the third harmonic 3Fo will be shunted to ground. A second trap (rejector circuit) is formed by a fixed capacitor C34 and variable inductor L36. This second trap is tuned to the fundamental frequency Fo so that the fundamental frequency will be shunted to ground. An inductor L40 is coupled in parallel with the first trap and tuned such that the parallel combination of inductor L40 with the first trap forms a parallel resonator tuned substantially to pass the desired harmonic 2Fo for a doubler 2Fo. A capacitor C42 is coupled in parallel with the second trap and tuned such that the parallel combination of capacitor C42 with the second trap forms a parallel resonator also tuned to pass the desired harmonic 2Fo. The two traps are coupled by a coupling capacitor C44.

Variable capacitor C32 forms a primary tuning element of the tunable coupling circuit and variable inductor L36 forms a secondary tuning element of the network. Using this circuit configuration, the circuit can be tuned using the variable elements over a range of frequencies such that as the passband frequency 2Fo is changed the rejection frequencies are maintained at their proper ratios, i.e. at Fo and 3Fo. Thus, the relationship among the various passed and rejected harmonics becomes independent of the value of variable capacitor C32 and variable inductor L36.

First we will consider the primary circuit including variable capacitor C32 and inductors L30 and L40. The ratio of the finite pole frequency 3Fo to the band pass frequency 2Fo is independent of the value of the variable capacitor. Thus, over a design range of the coupling network, as variable capacitor C32 changes value, Fo changes. However the finite pole frequency is always 3Fo and the band pass frequency is always 2Fo.

In the following, Fp represents the passband frequency $$Fp = \frac{1}{2\pi \sqrt{(L40 + L30) C32}} \quad (1)$$

The rejection notch frequency is represented by Ft $$Ft = \frac{1}{2\pi \sqrt{L30 \cdot C32}}, \text{ then} \quad (2)$$

$$\frac{Ft}{Fp} = \sqrt{1 + \frac{L40}{L30}} \quad (3)$$

The ratio Ft/Fp is independent of the value of the tuning element C32. This allows the circuit to be tuned without affecting the ratio of the rejection frequency and the passband frequency. This ratio is determined by the ratio of L40 and L30. To reject higher order harmonics, Ft/Fp>1. For example, to reject the third harmonic and pass the second harmonic Fp=2Fo and Ft=3Fo:

$$\frac{Ft}{Fp} = \frac{3Fo}{2Fo} = \sqrt{1 + \frac{L40}{L30}}, \quad (4)$$

$$\frac{3Fo}{2Fo} = \frac{3}{2} \text{ or } \frac{9}{4} = 1 + \frac{L40}{L30}, L30 = 0.8 \, L40 \quad (5)$$

Both Ft and Fp change as variable capacitor C32 is tuned, yet their ratio remains the same. Therefore, the trap is automatically tuned to the proper frequency.

The second circuit (L36, C34 and C42) has the same property. Using the same definitions of Fp and Ft, the following relationships exist.

$$Fp = \frac{1}{2\pi \sqrt{L36 \frac{C34 \cdot C42}{C34 + C42}}} \quad (6)$$

$$Ft = \frac{1}{2\pi \sqrt{L36 \cdot C34}} \quad (7)$$

$$\frac{Ft}{Fp} = \frac{1}{\sqrt{1 + \frac{C34}{C42}}}, Ft/Fp < 1 \quad (8)$$

This configuration must be used in order to reject a lower order harmonic. Here the ratio of C34 and C42 determines the relative location of the trap frequency. For example, if it is desired to reject the fundamental frequency, Fo and to pass the second harmonic, 2Fo we obtain $$\frac{Ft}{Fp} = \frac{Fo}{2Fo} = \frac{1}{2}, \frac{1}{4} = \frac{1}{1 + \frac{C34}{C42}}; \text{ and} \quad (9)$$

$$C34 = 3 \cdot C42 \quad (10)$$

By tuning variable inductor L36, both Ft and Fp change by the same ratio. Therefore, even if the network is tuned to different frequencies, the correct tuning for harmonic rejection is maintained.

The complete interstage coupling network will present a center passband having finite poles above and below the passband with frequency ratios relative to the center frequency determined by the ratios of the fixed elements.

Of course, other multipliers are possible. In a tripler, it may be advantageous to reject only the second and fourth harmonics. It is also possible to add a network to produce another attenuation pole below the tuning frequency, such as to reject the fundamental frequency.

Figure 3:
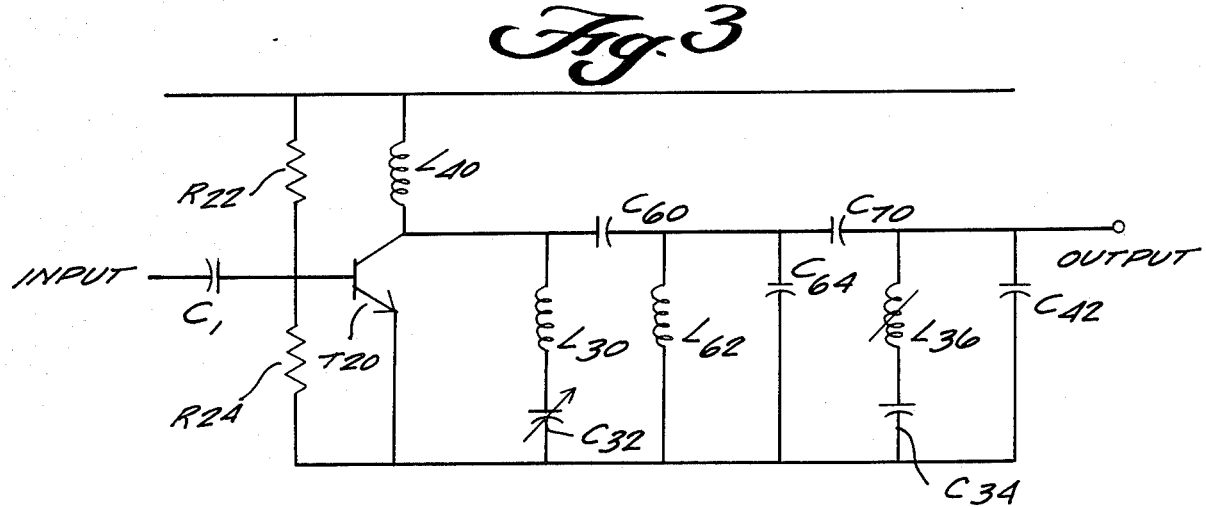
FIG. 3 is a schematic of a circuit similar to that shown in FIG. 2 but arranged with a standard resonator between the two rejection networks.

Referring now to FIG. 3, there is shown an alternative embodiment of the present invention wherein the filter network of the present invention is combined with a standard resonator. Reference numerals identical to those used in FIG. 2 represent like or corresponding parts to the FIG. 2 embodiment. The standard resonator with which the coupling circuit of the present invention is combined is represented by an inductor L62 and a capacitor C64 forming a parallel tuned circuit. The first and second stages are coupled through a coupling capacitor C60 and the second and third stages are coupled through a capacitor C70. This particular circuit arrangement allows for the use of lower Q inductors while maintaining adequate harmonic rejections.

The circuits shown in the drawings can be configured at their respective output ends to include an impedance transformation to match a lead impedance. The impedance transformation circuits can be of standard design. For example, instead of the shunt capacitor at the output, a series capacitor/shunt capacitor combination could be provided or merely a series capacitor could be provided.

While the invention has been described in connection with what is presently considered to be the most practical and preferred embodiments, it is to be understood that the invention is not limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What is claimed is:

1. A multiplier for generating a signal at a desired harmonic of a fundamental frequency excitation comprising:

a non-linear amplifier stage for providing, in response to said fundamental frequency excitation signal, an output including frequency components at said fundamental frequency and at harmonics thereof; and a tuned circuit having rejection notches above and below a passband frequency range including the desired harmonic of the fundamental frequency said tuned circuit including at least one tunable value component and one fixed value component, the circuit values of said fixed and tunable components being selected such that the circuit is tunable to select a desired harmonic over a predetermined range of fundamental frequencies, the tuning of said tunable component causing the rejection notches to move such that they are maintained at a predetermined frequency ratio with respect to the passband when the circuit is tuned so that the passband tracks the desired harmonic of the fundamental frequency over a range of fundamental frequencies.

2. A multiplier according to claim 1 wherein the multiplier circuit is a doubler and the rejection notches are provided at the fundamental frequency and the third harmonic thereof.

3. A multiplier according to claim 1 wherein the multiplier circuit is a tripler and the rejection notches are provided at the second and fourth harmonics.

4. A multiplier according to claim 1 further comprising a resonator circuit.

5. A doubler circuit for use with a nonlinear amplifier stage generating a signal having a fundamental frequency component Fo and various harmonic frequency components including a second harmonic component 2Fo and a third harmonic component 3Fo, said doubler circuit for isolating the second harmonic 2Fo by forming a passband at 2Fo and rejection frequencies at Fo and 3Fo, comprising:

a first trap having a first trap frequency defined by its elements and being tuned to 3Fo for shunting the third harmonic component to circuit ground, the first step including a variable capacitor and having a net capacitive reactance at 2Fo;

a first inductor coupled in parallel with the first trap and tuned such that the parallel combination of the first inductor with the first trap forms a parallel resonator establishing a passband at 2Fo;

a second trap having a second trap frequency defined by its elemenets and being tuned to Fo for shunting the fundamental frequency component to circuit ground, the second trap including a variable inductor and having a net inductive reactance at 2Fo;

a first capacitor coupled in parallel with the second trap and tuned such that the parallel combination of the first capacitor with the second trap forms a parallel resonator establishing a passband at 2Fo;

means for coupling said first and second traps in parallel with one another;

whereby (a) when the value of the variable capacitor of said first trap is changed, the ratio of the rejection frequency of the first trap to the passband frequency is maintained constant at 3/2 and (b) when the value of the variable inductor of said second trap is changed, the ratio of the rejection frequency of the second trap to the passband frequency is maintained constant at $\frac{1}{2}$.

6. A tripler circuit for use with a nonlinear amplifier stage generating a signal having a fundamental frequency component Fo and various harmonic frequency components including a second harmonic component 2Fo, a third harmonic component 3Fo, and a fourth harmonic component 4Fo, said tripler circuit for isolating the second harmonic 2Fo by forming a passband at 3Fo and rejection frequencies at 2Fo and 4Fo, comprising:

a first trap having a first trap frequency defined by its elements and being tuned to 4Fo for shunting the fourth harmonic component to circuit ground, the first trap including a variable capacitor and having a net capacitive reactance at 3Fo;

a first inductor coupled in parallel with the first trap and tuned such that the parallel combination of the first inductor with the first trap forms a parallel resonator establishing a passband at 3Fo;

a second trap having a second trap frequency established by its elements and being tuned to 2Fo for shunting the second harmonic component to circuit ground, the second trap including a variable inductor and having a net inductive reactance at 3Fo;

a first capacitor coupled in parallel with the second trap and tuned such that the parallel combination of the first capacitor with the second trap forms a parallel resonator establishing a passband at 3Fo; and means for coupling said first and second traps in parallel with one another;

whereby (a) when the capacitance of the variable capacitor of the first trap is varied, the ratio of the passband frequency to the rejection frequency of the first trap is maintained constant of 4/3 remains constant and (b) when the inductance of the variable inductor of said second trap is varied the ratio of the rejection frequency of the second trap to the passband frequency is maintained constant at $\frac{2}{3}$.

* * * * *